United States Patent [19]

Biferno

[11] Patent Number: 4,562,433
[45] Date of Patent: Dec. 31, 1985

[54] FAIL TRANSPARENT LCD DISPLAY

[75] Inventor: Michael A. Biferno, Duarte, Calif.

[73] Assignee: McDonnell Douglas Corporation, Long Beach, Calif.

[21] Appl. No.: 444,801

[22] Filed: Nov. 26, 1982

Related U.S. Application Data

[63] Continuation-in-part of Ser. No. 183,346, Sep. 2, 1980, Pat. No. 4,371,870.

[51] Int. Cl.⁴ .............................................. G09G 3/00
[52] U.S. Cl. .................................. 340/716; 340/781; 340/784
[58] Field of Search ................ 340/781, 784, 716, 705

[56] References Cited

U.S. PATENT DOCUMENTS 4,238,793 12/1980 Hochstrate .......................... 340/781

Primary Examiner—Marshall M. Curtis
Attorney, Agent, or Firm—Gregory A. Cone; George W. Finch; Donald L. Royer

[57] ABSTRACT

A display system is constructed such that upon failure of the primary display which comprises a Liquid Crystal Display (LCD) that becomes transparent upon failure, a backup display located directly beneath the primary display becomes visible to the display user.

11 Claims, 4 Drawing Figures

FAIL TRANSPARENT LCD DISPLAY

This is a Continuation-In-Part of U.S. patent application Ser. No. 183,346, filed Sept. 2, 1980, now U.S. Pat. No. 4,371,870.

BACKGROUND OF THE INVENTION

1. Field of the Invention

This invention concerns liquid crystal displays. Still more particularly, this invention concerns display systems in which a primary liquid crystal display becomes transparent in a failure mode and allows the viewer to observe a backup display located behind the primary LCD display when the primary display is disabled.

2. Description of the Prior Art

The last decade has witnessed a phenomenal increase in the use of digital as opposed to analog electronic instrumentation systems. In turn, liquid crystal display devices have been widely employed as display means for these digital electronic instrumentation systems. The liquid crystal display is highly desirable since it is a low power device which exhibits high visual contrast and it is adapted for a variety of different digital formats such as conventional alphanumeric and dot matrix displays. A few of the increasingly diverse uses to which liquid crystal displays have been put include aircraft flight control displays, automobile instrumentation, alphanumeric readouts for electronic calculators, wrist watches, electronic game displays, etc.

In particular, liquid crystal displays are being increasingly utilized as instrument displays in aircraft. It is particularly important in aircraft usages that redundant instrumentation be employed; hence, it is common for a primary instrument display to be presented in a central location while a redundant instrument supplying the same information will be necessarily located at some remote location within the cockpit of the aircraft. The problem, then, occurs when a failure occurs in the primary flight instrument display and the pilot is forced to look away from the centrally located primary display to view the corresponding backup instrument in a remote location. The disruption to the pilot's concentration in such circumstances can be quite severe and detrimental to the safe operation of the aircraft.

It is clear, therefore, that in aircraft, as well as many other liquid display usages, it would be highly desirable to be able to employ a primary liquid crystal display which would become transparent to the viewer, either upon power failure or the intentional disablement of the device, thereby enabling the viewer to observe other displays located directly behind the now transparent primary liquid crystal display. Unfortunately, no such fail transparent display system has been heretofore available. Conventional liquid crystal display technologies rely on either a mirrored reflected surface or a light trap behind the light blocking portions of the alphanumeric or graphic display of the liquid crystal display in order to provide sufficient contrast between the light blocking portions of the liquid crystal display activated by the electrical field and the background of the display for readability of the activated symbol.

SUMMARY OF THE INVENTION

A display system is provided comprising a primary liquid crystal display overlaying a secondary display such that upon termination of power to the primary liquid crystal display, the primary display becomes substantially transparent and the secondary display then becomes visible to the viewer.

DETAILED DESCRIPTION OF THE INVENTION

As mentioned above, the display system contemplated by this invention comprises a primary display made up of a liquid crystal display and a secondary display which becomes visible only upon the termination of power to the primary liquid crystal display.

In one embodiment of this invention the primary liquid crystal display would have the capability of presenting information such as dot patterns or alphanumeric segments which would appear as dark letters, symbols, or other such graphic displays on a bright background. The dark graphics and the bright reflective background are produced from two different types of liquid crystal displays which maintain their light blocking and reflective characteristics respectively only upon the application of an electrical field across each such liquid crystal display. When the electrical field is terminated due either to a power failure or the intentional turning off of the power supply, the two liquid crystal displays revert to a state wherein they are both transparent.

Figure 1:
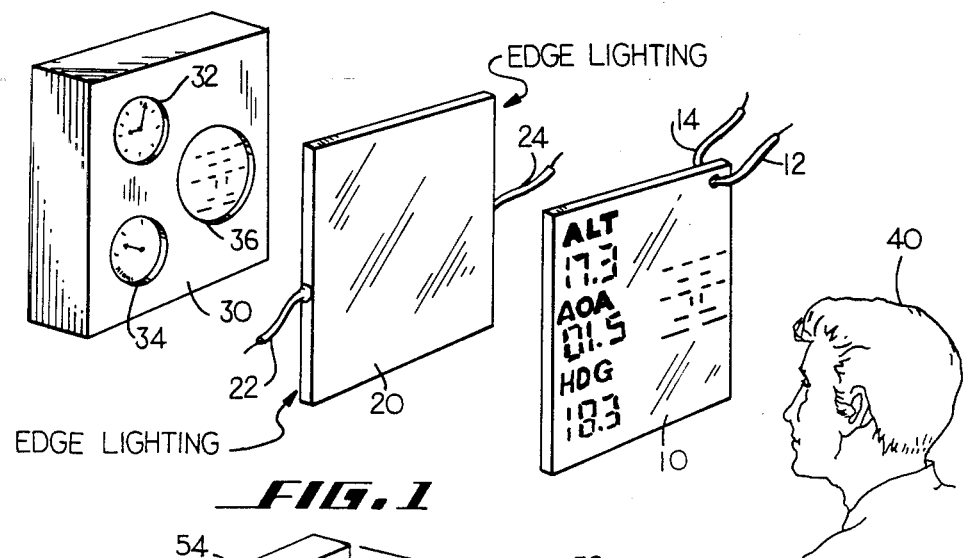
FIG. 1 is an isometric representation of the basic construction of one embodiment of the display system.

This particular embodiment may be better understood by reference to FIG. 1 which shows an exploded isometric view of this embodiment of the display system. The application illustrated in FIG. 1 is to an aircraft flight instrument display panel. A first liquid crystal display means 10 presents a variety of different flight instrument data to the viewer 40. The information on the first liquid crystal display means 10 appears dark to the viewer 40 as viewed against the reflective background of the second liquid crystal display means 20. The first 10 and second 20 LCD means comprise the primary display. Backup instruments 32, 34, and 36 appear on the secondary or backup display 30. The first liquid crystal display means 10 operates in a conventional manner wherein appropriate electrical fields supplied by conductors 12 and 14 are applied across the liquid crystal display means to form the necessary alphanumeric and graphical display images upon the first liquid crystal display means. In most applications individual portions or elements of a display are independently actuated to form a desired image on the display 10. In most embodiments this requires the use of a "field effect" LCD. These images appear dark to the viewer primarily due to their light blocking properties which effectively screen the majority of the light reflecting from the second liquid crystal display means 20 from reaching the viewer 40. This light blocking action is most commonly implemented by applying a polarizing film, or films, not shown, to the first display means 10. This blocking of the reflected light by the actuated image is effected by the combined action of the polarizing film(s) and the actuated LCD elements which act together in a manner similar to that of crossed polarizers to effectively attenuate light transmission through the actuated images of the display 10. This technology is well within the expertise of one of ordinary skill in the art and will not be further discussed herein. The second liquid crystal display means 20 operates exclusively in the reflective mode inasmuch as, upon application of power to this display through appropriate conductors 22 and 24, the liquid crystal material will appear white to the viewer in typical lighting situations. This effect results because a substantial percentage (commonly about 70%) of the light falling upon this display will be scattered or reflected back to the viewer. The second liquid crystal means 20 for most usages will be a "dynamic scattering" type LCD.

In situations where the ambient light level in the viewer's work area is below about 20 to 50 foot candles, edge lighting of the first and second liquid crystal display means may be required to permit sufficient contrast between the two display means of the primary display. For such situations, the edge lighting or other appropriate means of increasing the incident light to the display would improve the readability of the display system. For such applications, a gap would be required between the first and second display means to allow the edge lighting to impinge upon the entirety of the reflecting surface of the second display means 20.

As stated above, upon termination of the electrical field across both the first 10 and second 20 liquid crystal displays, both displays will then become substantially transparent to the viewer 40, allowing the viewer to observe the secondary display panel 30. The information displayed on the secondary display 30, as illustrated in FIG. 1, is presented by electromechanical analog gages which are direct backups for the digital information presented upon the primary liquid crystal display. However, the information contained in the secondary display 30 need not necessarily be redundant to that displayed upon the primary display. Indeed, the secondary display could comprise further liquid crystal displays having the same or different information content from the primary display. In fact, the secondary display could mimic the power off-transparent capability of the primary display and could, in turn, overlay a further display beneath it, and so on, such that a plurality of different displays could be stacked, one upon the other, with all but the bottom most display being transparent in a power off mode. This configuration would comprise a plurality of light blocking LCD means similar to the first LCD means 10 stacked over a single reflective LCD means 20.

Figure 2:
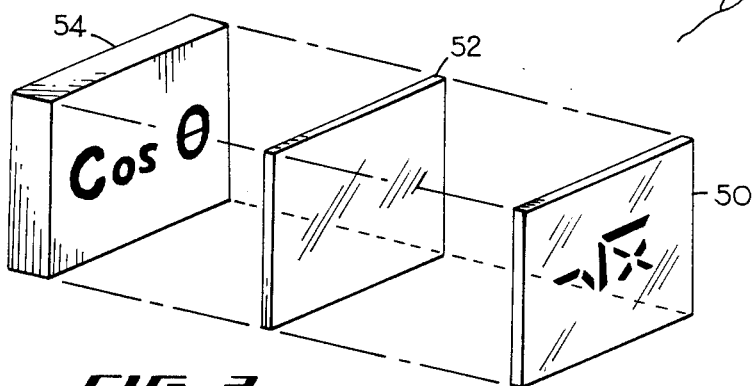
FIG. 2 is a representation of an additional embodiment of the display system as employed in a multilegend key.

In another closely related embodiment, a display system of this invention can be readily adapted to a display capable of showing one of two predetermined or dedicated messages. One message would be available when no power is being applied to the display while an alternative message would be available when power is supplied to the display. One such application is that illustrated by FIG. 2 which shows a multi-legend key such as that employed on a hand held calculator or the like. On many conventional hand held calculators, multi-legend keys are employed with one legend being printed on the key itself and a second legend being printed above the key. The second legend is indicative of the functon portrayed only if an appropriate mode select key has been depressed elsewhere on the calculator. In the application disclosed herein, the multi-legend key would provide two different legends at the same location, the key surface itself. The ambiguity of present and conventional devices over which legend is active at any given time is eliminated, since only one legend would be visible at a given time. This application would also permit the calculator keys to be made larger, since space would not have to be reserved between the keys for the printing of the second legend. The instant multi-legend key would comprise the basic display system disclosed hereinabove. The first legend 54 would be a legend indicative of the function more frequently used. Since this is the more frequently used legend, the display would be operated in a power off mode, leaving the second legend as implemented by the liquid crystal display means 50 and 52 in a transparent mode. The second legend is the alternate function which is selected by activating a mode select key. This mode select key, not shown, would supply an appropriate electrical field to the liquid crystal display means 50 and 52 by conductors, not shown, thereby causing the graphic display of the second legend to become dominant, thereby completely covering the first legend which had been painted or otherwise affixed to the key 54. The required power to produce the electrical field across the second legend for this application would be very low.

Figure 3:
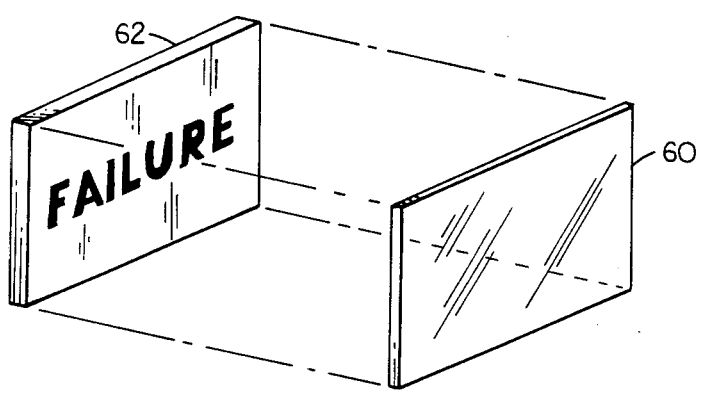
FIG. 3 is a representation of an additional embodiment of the display system as employed in a failure indicator.

Yet another embodiment of this display system finds application as failure indicator. This particular embodiment would utilize only the second of the two liquid crystal display means which would operate in either a translucent or opaque mode upon application of an appropriate electrical field across the liquid crystal display means. In a normal or non-failure condition, power would be applied across the liquid crystal display means and the failure indicator, as portrayed upon the surface of the secondary display, would be invisible to the viewer. However, upon the occurance of a failure condition, power would be cut off to the liquid crystal display means, causing the liquid crystal to become transparent, thereby exposing the failure indicator affixed to the secondary display means. This embodiment is illustrated in FIG. 3 wherein the liquid crystal display means 60 overlies the secondary display means 62 which contains the failure indicator upon its frontal surface. Under normal operating conditions, the electrical field will be applied across the liquid crystal display means 60 by conductors, not shown. Under a power failure condition, the LCD means 60 becomes transparent and exposes the underlying failure indicator 62. In one configuration of this embodiment, the failure indicator comprises an appropriate message inscribed with luminescent paint. When utilized as a power failure indicator, this embodiment would find natural application to battery failure indicators. As such, it would be a low cost, low power device with no moving parts which would require no power to display a failure status for the battery.

Figure 4:
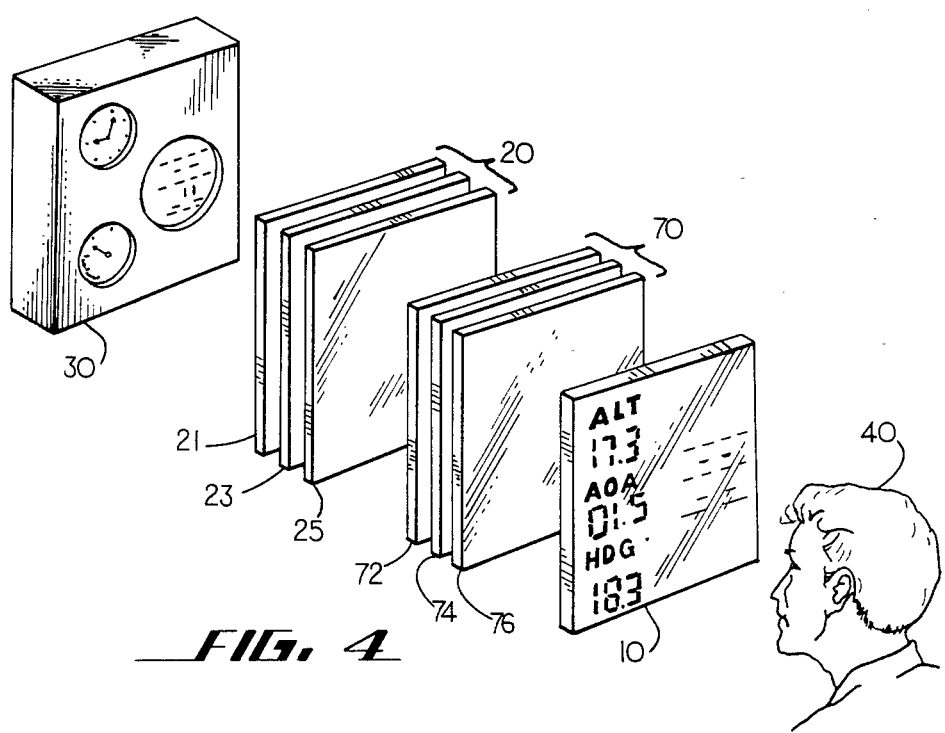
FIG. 4 is a representation of an embodiment which additonally employs a fail-transparent, electroluminescent panel in the primary display.

In another embodiment, an electroluminescent panel is employed within the primary display to increase the suitability of the system for low ambient light conditions. This embodiment is illustrated in FIG. 4. It is similar to the system shown in FIG. 1 in that it contains the information-bearing first liquid crystal display means 10 and the reflective background produced by the second liquid crystal display means 20. LCD's 10 and 20 comprise the primary display means in FIG. 1. In the FIG. 4 embodiment, an electroluminescent panel means 70 is interposed between the first and second LCD means 10 and 20. In more detail, the AC thin film electroluminescent panel means 70 will normally comprise an intermediate layer of an electroluminescent material 74 sandwiched between two transparent electrode layers 72 and 76. In a non-energized or disabled state, the electroluminescent panel means 70 will be transparent, and the overall system will function in the same manner as the embodiment shown in FIG. 1. However, in low ambient light environments, the edge lighting which is utilized in FIG. 1 for some usages may not be sufficient, and the electroluminescent panel means will be energized to provide sufficient back lumination for the primary display means. In further detail, the second liquid crystal display means 20 which provides the fail-transparent reflective background for the primary display will most commonly comprise a sandwich of a liquid crystal layer 23 disposed between two transparent electrode layers 21 and 25. Appropriate operation of the electrode layers causes the liquid crystal to create a reflective backdrop for the information displayed on the first LCD 10 of the primary display. Not shown are various transparent insulating layers which electrically separate the functional elements of the system. The system for this embodiment is completed by the backup display 30.

By allowing at least two display systems to be stacked one upon the other, the display system of this invention enables an instrumentation designer to achieve a much more space efficient instrument display. The viewer of the instrument display also benefits since, in the event of an instrument failure, the redundant instrument appears automatically at the same location as the now failed but transparent primary instrument display.

I claim:

1. A display system comprising:
a primary liquid crystal display comprising a first liquid crystal display means located closest to a viewer wherein information is presented to the viewer within an at least one information location on the first display means, a second liquid crystal display means located an effective distance behind the first display means wherein substantially all of the second liquid crystal display means is energized to operate in a reflective mode simultaneously with said presentation of information on said first display means and a selectively energizable electroluminescent panel means interposed between the first and second liquid crystal display means which provides illumination for the first liquid crystal display means when energized and is substantially transparent when not energized, the electroluminescent panel means comprising an intermediate layer of a transparent electroluminescent material held between two transparent electrode layers; and
a secondary display wherein the secondary display is located directly behind the primary liquid crystal display such that, upon a termination of power to the primary liquid crystal display, the primary liquid crystal display becomes substantially transparent and the backup display then becomes visible to the viewer.

2. The system of claim 1 wherein the first liquid crystal display means comprises a field effect type liquid crystal display.

3. The system of claim 1 wherein the second liquid crystal display means comprises a dynamic scattering type liquid crystal display.

4. The system of claim 1 wherein the secondary display comprises a key having a first symbol depicted thereon indicative of a first function of a machine operated by the key and wherein the information presented upon the primary display comprises a second symbol indicative of a second function of the machine wherein the second function is activated substantially concurrently with an application of power to the primary display.

5. The display system of claim 1 wherein the selectively energizable electroluminescent panel means comprises an alternating current thin film electroluminescent panel.

6. A display system comprising:
a primary liquid crystal display comprising a plurality of first liquid crystal display means disposed in a stack wherein at least one first display means is selectively energized such that information is presented to a viewer on said energized first display means, a second liquid display crystal means disposed directly behind the plurality of first liquid crystal display means wherein substantially all of the second liquid crystal display means is energized to operate in a reflective mode simultaneously with said presentation of information on said first display means and a selectively energizable electroluminescent panel means interposed between the first and second liquid crystal display means which provides illumination for the first liquid crystal display means when energized and is substantially transparent when not energized, the electroluminescent panel means comprising an intermediate layer of a transparent electroluminescent material held between two transparent electrode layers; and
a backup display wherein the backup display is located directly behind the primary liquid crystal display such that, upon a termination of power to the primary liquid crystal display, the primary liquid crystal display becomes substantially transparent and the backup display then becomes visible to the viewer.

7. The display system of claim 6 wherein the first liquid crystal display means comprise field effect type liquid crystal displays.

8. The display system of claim 6 wherein the first liquid crystal display means comprises a dynamic scattering type liquid crystal display.

9. The display system of claim 6 wherein the selectively energizable electroluminescent panel means comprises an alternating current thin film electroluminescent panel.

10. The display system of claim 1 further comprising edge lighting means for illumination of the second liquid crystal display means.

11. The display system of claim 6 further comprising edge lighting means for illumination of the second liquid crystal display means.

* * * * *

UNITED STATES PATENT AND TRADEMARK OFFICE
CERTIFICATE OF CORRECTION

PATENT NO. : 4,562,433

DATED : 31 December 1985

INVENTOR(S) : Michael A. Biferno

It is certified that error appears in the above-identified patent and that said Letters Patent is hereby corrected as shown below:

On the Title Page, Item [54] and in column 1, line 1, the title "FAIL TRANSPARENT LCD DISPLAY" should be
-- FAIL TRANSPARENT LCD DISPLAY WITH BACKUP--.

Signed and Sealed this

Fifth Day of September, 1989

Attest:

DONALD J. QUIGG

*Attesting Officer*  *Commissioner of Patents and Trademarks*